United States Patent
Lev et al.

(10) Patent No.: US 7,195,817 B2
(45) Date of Patent: Mar. 27, 2007

(54) DIAMOND COATED ARTICLE AND METHOD OF ITS PRODUCTION

(75) Inventors: Leonid C Lev, West Bloomfield, MI (US); Yang T Cheng, Rochester Hills, MI (US); Michael J Lukitsch, Port Huron, MI (US); Anita M Weiner, West Bloomfield, MI (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 10/673,762

(22) Filed: Sep. 29, 2003

(65) Prior Publication Data

US 2005/0069709 A1    Mar. 31, 2005

(51) Int. Cl.
*G11B 5/64* (2006.01)

(52) U.S. Cl. ........................ 428/336; 51/307; 51/309; 428/216; 428/408; 428/469; 428/472; 428/697; 428/698; 428/699

(58) Field of Classification Search ................ 428/408, 428/698, 697, 699, 336, 472, 469, 216; 51/307, 51/309
See application file for complete search history.

(56) References Cited

U.S. PATENT DOCUMENTS

| RE32,093 E | | 3/1986 | Hale |
| 4,707,384 A | * | 11/1987 | Schachner et al. .......... 428/408 |
| 4,992,082 A | * | 2/1991 | Drawl et al. .................. 51/298 |
| 5,135,808 A | * | 8/1992 | Kimock et al. ............. 428/698 |
| 5,224,969 A | * | 7/1993 | Chen et al. ................. 428/408 |
| 6,087,025 A | * | 7/2000 | Dearnaley et al. .......... 428/698 |
| 6,187,421 B1 | | 2/2001 | Moriguchi et al. |
| 6,287,682 B1 | | 9/2001 | Grab et al. |
| 6,337,152 B1 | | 1/2002 | Kukino et al. |
| 6,904,935 B2 | * | 6/2005 | Welty et al. ........... 137/625.17 |

\* cited by examiner

*Primary Examiner*—Archene Turner
(74) *Attorney, Agent, or Firm*—Kathryn A. Marra

(57) ABSTRACT

A diamond coated cutting tool is disclosed having a either steel or cemented carbide substrate. The interior layer disposed between the diamond coating and the substrate inhibits the diffusion of carbon and other species.

34 Claims, 1 Drawing Sheet

DIAMOND COATED ARTICLE AND METHOD OF ITS PRODUCTION

FIELD OF THE INVENTION

The present invention is related to a coated article and, more particularly, to a diamond coated article, consisting of a hard substrate coated with a diamond coating.

BACKGROUND OF THE INVENTION

Due to exceptional mechanical properties of diamond, such as its high compressive strength, hardness and wear resistance, existing diamond-coated articles usually fail not due to wear of the coating itself, but due to insufficient strength of the interface between the diamond coating and the substrate.

Diamond coating can be deposited on a metallic substrate or on a substrate made out of ceramic composite material. The examples of metallic substrate may be high-speed steel (HSS) substrate or stainless steel (SS) substrate. Both HSS and SS are alloys of iron (Fe) with carbon (C) and other alloying elements. The examples of the substrate made out of composite material may be cemented carbide substrate, which has a structure of tungsten carbide (WC) grains, bound together by a cobalt (Co) binder.

Diamond coating deposition is carried out at elevated temperatures, usually at 850° C., in the atmosphere of atomic carbon (C) and hydrogen (H). Upon cooling from the deposition temperature to ambient temperature, the dimensions of coated objects usually change and they shrink. The amount of shrinkage is governed by the coefficient of thermal extension (CTE). The CTE's of the diamond coating and the aforementioned substrates differ substantially. For example, HSS and SS substrates have CTE of approximately $13*10^{-6}$, and cemented carbide substrates have CTE of $3*10^{-6}$, both large compared with the CTE of diamond of $0.3*10^{-6}$. Upon cooling from the deposition temperature, due to large difference between the CTE's of the coating and substrate, the substrate shrinks more. Hence, the diamond coating develops high level of compressive residual stress. This CTE mismatch and resulting residual stress buildup limit the thickness of the diamond coating and may result in coating delaminating from the substrate.

It has been established that Fe acts as a catalyst converting the adjacent layer of diamond into graphite. The detrimental catalytic effect of Fe leads to the formation of the layer of graphitic carbon and degrades the adhesion on diamond-cemented carbide interface. Similarly, Co, which is typically used as a binder in cemented carbides, is detrimental to deposition of well-adhered diamond films. In a manner similar to Fe, Co acts as a catalyst converting the adjacent layer of diamond into graphite and degrading the adhesion on diamond-cemented carbide interface. As a result of the described catalytic affect, the direct deposition of diamond on steel or cemented carbide substrate results in the formation of a non-adhering layer of graphitic soot covered by poor-quality diamond. Also, high diffusion rate of carbon atoms into the Fe- or Co-containing substrate leads to loss of carbon atoms from the interface, leaving voids behind and degrading the interface strength even further. As such, the steel and cemented carbide both fall into the category of carbon-sensitive materials.

To improve the adhesion of diamond coatings to carbon-sensitive materials, it has been proposed to use ceramic interfacial layers, acting as diffusion barriers. These ceramic layers are interposed between the substrate and the diamond coating. However, the ceramic interfacial layers do not form chemical bonds with diamond and therefore, do not provide good adhesion between the diamond coating and the substrate. As a result, the adhesion between diamond coating and carbon-sensitive substrates remains a problem.

To improve the adhesion of diamond coating to cemented carbide it has been proposed to etch away the Co binder from the surface layers of cemented carbide. This prevents possible contact of Co with the diamond coating. To this end, various techniques, including acid etching, have been developed. However, etching of Co binder reduces the interfacial surface strength of the cemented carbide article due to loose WC particles. The loose WC particles provide a weak interface for diamond coating. Furthermore, since cemented carbide articles usually fail in a brittle manner, most often due to presence of small cracks at or near the surface, the aforementioned etching of the Co binder substantially reduces the strength of the WC substrate itself.

Binderless cemented carbides with very small fraction of Co binder in them have been suggested, and a diamond coating on them has been proposed. However, the properties of thus made articles have been less than satisfactory due to low fracture toughness of the binderless cemented carbide. It has also been proposed to use thermo-chemical treatment, such as boronizing, i.e., infiltration of the surface layers of cemented carbide with boron, to provide a diffusion barrier separating cobalt binder and diamond coating. However, this leads to a significant loss of fracture toughness of these surface layers and weakening of the cemented carbide article.

The ceramic interfacial layers do not provide stress relieve for diamond coating and do not prevent the residual stress buildup due to CTE mismatch. Thus, upon the cooling to ambient temperature the diamond coating deposited on a substrate with a ceramic interfacial layer is under high residual stress, which limits the coating thickness and may lead to its delamination, as mentioned above.

It has been proposed to use metallic layer of carbide-forming metal to separate the surface of cemented carbide from the diamond coating. However, under the conditions of diamond coating deposition the carbide-forming metal consumes carbon from the surface layers of the cemented carbide, leading to its de-carburization and formation of a brittle η-phase in case of WC. Also, under the conditions of diamond coating deposition the carbide-forming metal may inter-diffuse into the substrate in case of steel.

Also, a two-layered protective coating has been proposed, with the first layer consisting of carbon diffusion barrier selected from the group consisting of MetCO, MetCON and MetON atop and adjacent to the substrate and a second (next innermost) wear resistant coating of at least one layer of MetC, MetN or MetCN, where Met is Ti, Hf, V, Zr, Si, B or other metals of subgroup 3–7 of the periodic table of the elements, or a mixture thereof. However, the oxygen containing in the first layer may diffuse away, resulting in changes in the coating properties. The proposed design of interfacial layers does not relive stress buildup in diamond coating. Also, the proposed two-layered structure is complicated and expensive to deposit.

As such, what is needed is a diamond-coated article which inhibits the diffusion of carbon from the diamond coating. What is additionally needed is a diamond coated composite structure having interfacial layers which resist the diffusion of carbon and do not suffer the aforementioned deficiencies of the prior art.

SUMMARY OF THE INVENTION

As such, it is an object of the present invention to provide an article, which overcomes the deficiencies of the prior art. In one embodiment of the invention, a diamond-coated substrate is disclosed. Disposed between the diamond coating and the substrate is an interfacial composite laminate, comprising at least one ceramic interfacial layer adjacent to and adjoining the substrate and at least one metallic interfacial layer over the ceramic interfacial layer. The thickness of the ceramic interfacial layer is greater than the diffusion depth of either atoms from metallic layer or substrate atoms under the conditions of diamond deposition. The thickness of the metallic layer is greater than the depth of diffusion of carbon under the conditions of diamond deposition. While the ceramic layer provides a diffusion barrier between the metallic layer and the substrate during the diamond deposition, the metallic layer provides an adhesion layer for the diamond coating.

In another embodiment of the invention, a diamond-coated substrate is disclosed. Disposed between the diamond coating and the substrate is an interfacial composite laminate comprising a ceramic interfacial layer and a metallic interfacial layer. During the diamond deposition, the top stratum of the metallic layer is converted into carbide due to diffusion of carbon atoms, thus providing good adhesion to diamond coating and a diffusion barrier. While the outer stratum of the metallic layer is converted into carbide, the inner stratum of the metallic layer is preserved unchanged. Under the elevated temperature conditions, found during the diamond coating deposition, this inner stratum of metallic layer has low resistance to shear deformation. As a result, it can deform plastically and relieve the residual stress that may buildup in the diamond coating. Also, this preserved stratum of the metallic layer improves the overall strength of the substrate. The outer stratum of the metallic layer, converted into carbide, serves as a hard substrate for the diamond coating.

In another embodiment of the present invention, a diamond-coated steel article is disclosed having a steel substrate and interfacial composite laminate disposed between the diamond coating and the substrate. At least one interfacial layer of the interfacial composite laminate is metallic and consists of Cr, Ti, Zr, W, Ni or other carbide-forming metals or mixtures thereof. The thickness of the metallic interfacial layer is greater than the depth of carbon diffusion under the conditions used during diamond deposition. During deposition of the diamond layer on the metallic layer, the outer stratum of this metallic layer is converted into carbide due to diffusion of carbon atoms, thus providing good adhesion to diamond coating and a diffusion barrier. The thickness of the metallic interfacial layers is greater than the carbon diffusion depth and, thus, the metallic layer is only partially converted into metal carbide. The inner stratum of the metallic layer is preserved unchanged.

In another embodiment of the invention, the interfacial composite laminate comprises additional interfacial layers within the aforementioned systems having ceramics, such as nitrides, borides or carbides of transitional metals between the substrate and the metallic interfacial layer, to prevent the inter-diffusion between a metallic interfacial layer and the substrate.

In another embodiment of the invention, a topcoat of diamond-like carbon such as a mixture of sp2- and sp3-bonded carbon may be provided on top of diamond coating to fill in the roughness valleys between diamond grains.

In another embodiment of the invention, the aforementioned articles may be heat-treated after the diamond deposition, resulting in a substrate with a martensite structure. This will further relieve residual stress in the diamond coating due to increase in volume of steel during martensite transformation.

In another embodiment, a method of producing a steel article coated with diamond coating is provided. According to this method, the steel substrate is first coated with a number of interfacial layers, with at least the top interfacial layer being metal such as Cr, Ti, Ni, W, etc. A diamond coating is deposited on top of metallic interfacial layer. The outer stratum of the interfacial metallic layer is converted into carbide during the diamond deposition. Optionally, after the required thickness of diamond is achieved, the layer of mixed sp2- and sp3-bonded carbon is deposited by lowering the hydrogen bombardment rate through decrease in flow of hydrogen-producing gas through the chamber.

In another embodiment of the present invention, a diamond coated cemented carbide article is disclosed having a cemented carbide substrate and interfacial layers disposed between the diamond coating and the cemented carbide substrate. At least one interfacial layer is metallic. This metallic interfacial layer increases the strength of the cemented carbide article and inhibits the formation of graphite layer during the diamond deposition by reducing the interaction of cobalt within the cemented carbide substrate with the diamond coating.

In another embodiment of the invention, a cemented carbide composite material is disclosed. The cemented carbide composite has interfacial layers, with at least one interfacial layer selected from a group consisting of high recrystallization temperature amorphous nitrides, high recrystallization temperature amorphous borides, and high recrystallization temperature amorphous carbides.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
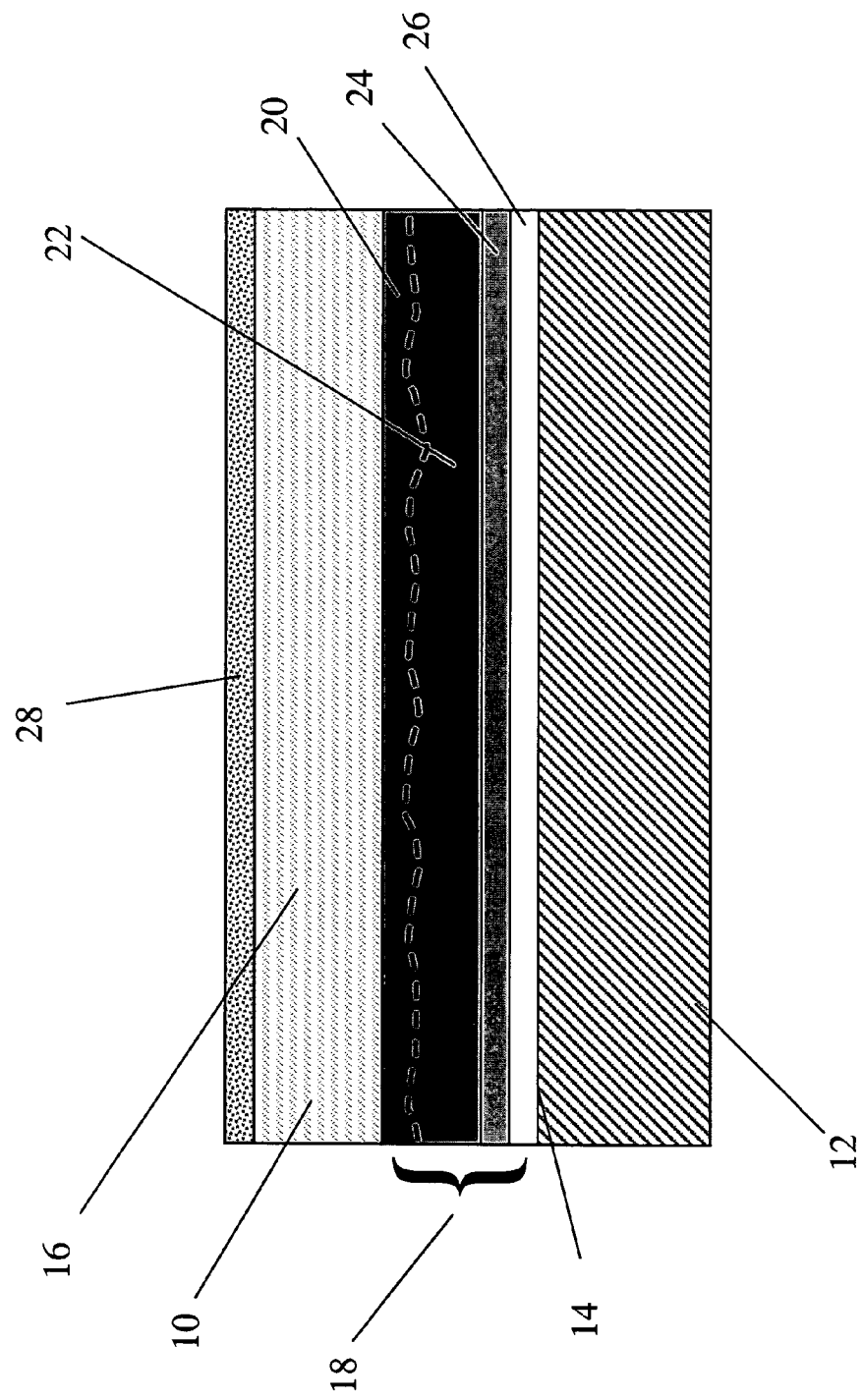
FIG. 1 represents a cross-sectional view of a composite material according to the teachings of the present invention.

The following descriptions of the preferred embodiments are merely exemplary in nature and are in no way intended to limit the invention, its application, or uses.

FIG. 1 represents a composite laminate according to the teachings of the present invention. As shown, the material 10 has a base or substrate layer 12 formed of a carbon sensitive material such as tool steels or ceramic materials. Defined adjacent a surface 14 of the material 10 is a high carbon content layer 16 such as a diamond coated layer. Disposed between the diamond coating layer 16 and the substrate layer 12 is an intermediate interfacial barrier laminate 18, which functions to produce a carbide rich layer 20 between the interfacial barrier laminate 18 and the diamond coating layer 16. The interfacial layer functions to prevent diffusion of carbon from the diamond coating layer 16 into the substrate layer 12 as well as functions to provide good adhesion between the diamond coating layer 16 and the interfacial barrier laminate 18. While the interfacial barrier laminate 18 is depicted as a single laminate layer, it is envisioned that the interfacial barrier laminate 18 can additionally take the form of a multi-layer laminate structure.

In a multi-layer configuration, at least the top metallic layer 22 of the interfacial barrier laminate 18 consists of Cr, Ti, Zr, W, Ni or other carbide-forming metals or mixtures thereof. During the deposition of diamond, the carbide rich stratum or layer 20 of the interfacial barrier laminate 18 is converted into carbide due to diffusion of carbon atoms. The carbide rich stratum 20 of the interfacial barrier laminate layer 18 is formed in the metallic layer 22, which provides good adhesion between the diamond coating layer 16 and the interfacial barrier laminate 18. The thickness of the metallic layer 22 is greater than the carbon diffusion depth of the carbide rich stratum 20 and, thus, the metallic layer 22 is only partially converted into carbide. The remaining part of the metallic layer 22 has low resistance to plastic deformation at elevated temperatures and is therefore configured to relieve residual stress in the diamond coating layer 16.

Should the substrate layer 12 be formed of high speed steel, at least one of the interfacial layers of the interfacial barrier laminate 18 and the substrate layer 12 is a ceramic interfacial layer 24. This ceramic interfacial layer 24 is configured to prevent the inter-diffusion of materials between the steel substrate 12 and the metallic interfacial layer 22. Additional interfacial layers 26 may be provided consisting of ceramics, such as nitrides, borides or carbides of transitional metals between the steel substrate and a metallic interfacial layer, to further prevent the inter-diffusion of materials between the metallic layer 22 and the substrate layer 12, as well as add stress relieving properties.

High speed steel is characterized by high strength, hardness and wear resistance. The chemical composition of the high speed steel substrate includes 1% of C, up to 18% of W, up to 10% of Mo, up to 5% of V, and may include other alloying elements. Proper heat treatment for this steel includes heating to elevated temperatures with the formation of microstructure of highly alloyed austenite, followed by quenching that leads to a microstructure of martensite. The volume of steel increases during this martensite transformation while density decreases. Specific volume of austenite with carbon content of 0.2% to 1.4% is 0.12227 to 0.12528 $cm^3$/gram, while that of marten cite is in the range of 0.12708 to 0.13061 $cm^3$/gram. Exposure of high speed steel to high temperature during diamond deposition may change its structure. Namely, the martensite may dissolve and ferrite may form, with a significant drop in hardness and wear resistance. Typical chemical composition of stainless steel includes 0.1% of C, 18% of Cr, 10% of Ni, 1% of Ti, and may include other alloying elements.

When the material 10 has a base or substrate layer 12 formed of a cemented carbide material, similar interfacial layers are disposed between the diamond coating layer 16 and the cemented carbide substrate layer 12. At least one layer of the interfacial barrier laminate 18 is a metallic layer 22. This metallic layer 22 increases the strength of the cemented carbide article 10 and inhibits the formation of a graphite layer during the diamond deposition by reducing the interaction of cobalt within the cemented carbide substrate with the diamond coating.

The cemented carbide substrate 12 is a composite material, consisting of carbide grains bound together by a metal matrix. It is envisioned the carbides are those of tungsten, WC, titanium, TiC, vanadium, VC, and some others. The most widely used metal matrix is cobalt. The matrix acts as a tough "glue" or "cement", holding together hard but brittle tungsten carbide grains ("blocks").

Optionally, the cemented carbide composite 10 has additional interfacial layers 26, with at least one interfacial layer selected from a group consisting of high recrystallization temperature amorphous nitrides, high recrystallization temperature amorphous borides, and high recrystallization temperature amorphous carbides.

Optionally, the diamond coated cemented carbide material 10 has an interfacial layer or layers 26 having a metallic layer 22 which is selected from Cr, Ti, Ni, Zr or W, or other metals or their mixtures, and a ceramic interfacial layer that is selected from the group of borides, nitrides, and carbides of transition metals.

As with steel based substrates, during the diamond deposition the top stratum of a metallic layer 22 is converted to metal carbide. The thickness of the metallic layer 22 is selected to be larger than the depth of carbon diffusion under the diamond deposition conditions. As such, only the part of the metallic layer 22 is converted to carbide. The remaining part of this metallic layer 22 remains metallic. The metallic layer 22 preserves the materials toughness and low resistance to plastic deformation at elevated temperature. The metallic layer 22 further deforms plastically after the diamond deposition and reduces the residual stress in diamond coating layer 16. Also it alleviates the weakening effect of the surface imperfections of cemented carbide on its strength.

The optional additional interfacial layers 26, which serve as a catalyst diffusion barrier, may consist of high recrystallization temperature amorphous nitrides, borides, and carbides. In this regard, a high recrystallization temperature generally corresponds to a temperature higher than the temperature seen by the material during its use. The intermediate layer has a thickness of between 2 μm and 15 μm and preferably between 5 μm and 10 μm.

Alternatively, the additional interfacial layers 26 can take the form of boride nitrides and carbides of transition materials. By way of non-limiting example, these carbides can include TiC, TiCN, TiAl, TiN, CrN, CrC, ZrN, and ZrC. Additionally, the additional interfacial layers 26 can take the form of aluminum oxide materials such as $Al_2O_3$.

It is specifically envisioned that an intermediate barrier layer 26 for reducing the formation of graphite can consist of a metallic or semi-metallic layer. This metallic or semi-metallic layer can be formed of material such a Cr, Ti, Zr, or can be silicon.

After the interfacial barrier composite laminate 18 has been deposited, the layer of diamond coating layer 16 is deposited over the material. This deposition may be done using, for example, Physical Vapor Deposition. Diamond coating is deposited on top of metallic layer 22, using, for example, Hot Filament Chemical Vapor Deposition. Optionally, after the required thickness of diamond coating layer 16 is achieved, a layer 28 of mixed sp2- and sp3-bonded carbon is deposited by lowering the hydrogen bombardment rate through decrease in flow of hydrogen-producing gas through the chamber. After the coating, the article with diamond coating on it may be heat-treated by heating it in vacuum and quenching it in a jet of a noble gas or other nonreactive gas and annealing. The mixture of sp2- and sp3-bonded carbon on top of diamond coating functions to fill in the roughness valleys between diamond grains.

Should the substrate layer 12 be formed of steel, the entire steel composite may be heat-treated after the diamond deposition, resulting in a substrate layer 12 with a martensite structure. This will further relieve residual stress in the diamond coating layer 16 due to increase in volume of steel substrate layer 12 during martensite transformation.

A method of producing a steel composite article coated with diamond coating is now described. It is envisioned that the following method is equally applicable to deposition of diamond coatings on other substrate materials. The steel substrate is first coated with a number of interfacial layers, with at least the top interfacial layer being metal such as Cr, Ti, Ni, W, etc. This deposition may be done using, for example, Physical Vapor Deposition. Diamond coating is then deposited on top of metallic interfacial layer, using, for example, Hot Filament Chemical Vapor Deposition. After the required thickness of diamond is achieved, the layer of mixed sp2- and sp3-bonded carbon is optionally deposited by lowering the hydrogen bombardment rate through decrease in flow of hydrogen-producing gas through the chamber. After the coating, the article with diamond coating on it may be heat-treated by heating it in vacuum and quenching it in a jet of a noble gas or other nonreactive gas and annealing.

When forming a ceramic based composite, the interfacial layer 18 can be applied onto the ceramic carbide substrate 12 using CVD, PVD, and electroplating processes or combinations thereof. In this regard, the continuous film will preferably be vapor deposited, sprayed or electrolessly deposited onto the composite using conventional Physical Vapor Deposition (PVD), spraying or electroless a.k.a. autocatalytic) deposition techniques well known in the art.

PVD or sputtering can be used to deposit all of the conductive materials identified above as comprising the interface layer. In the electroplating process, the composite is made the cathode in an electroplating cell having an electrolyte containing a salt of the metal being deposited. When electrical current passes through the cell at an appropriate potential, the desired metal deposits out on the surface of the cathodic composite. In the electroless (i.e. autocatalytic) process the surface of the composite is seeded with a catalyst and then exposed to a bath containing ions of the metal to be deposited. The catalyst initiates reduction of the metal ions to elemental metal, which forms a metal film on the surface of the substrate. In the PVD and sputtering processes, the material to be plated condenses on the substrate from a vapor thereof. The continuous interface film or layer may also comprise a layer of high temperature amorphous carbide material having a higher recrystallization temperature (e.g. >90%) than the underlying composite substrate.

The description of the invention is merely exemplary in nature and, thus, variations that do not depart from the gist of the invention are intended to be within the scope of the invention. For example, although the laminate material disclosed is envisioned to be in the form of a cutting tool insert, it is envisioned that the material can be used for non-tooling uses. Similarly, composite non-planar cutting implants are envisioned. Such variations are not to be regarded as a departure from the spirit and scope of the invention.

What is claimed is:

1. A composite structure, comprising:
   a substrate;
   an interfacial barrier laminate formed of at least two layers and disposed over the substrate, wherein the at least two layers include at least one ceramic layer disposed adjacent the substrate and at least one metallic layer; and
   a contiguous diamond coating disposed over the interfacial barrier laminate wherein the at least one metallic layer is partially converted into a carbide layer.

2. The composite structure according to claim 1 wherein the interfacial barrier laminate includes at least a third layer disposed between the at least one ceramic layer and the substrate, and wherein the at least a third layer is selected from the group consisting of high recrystallization temperature amorphous nitrides, high recrystallization temperature amorphous borides, high recrystallization temperature amorphous carbides, and combinations thereof.

3. The composite structure according to claim 1 wherein the at least one ceramic layer is selected from borides, nitrides and carbides of transition metals, and combinations thereof.

4. The composite structure according to claim 1 wherein the interfacial barrier laminate includes at least a third layer disposed between the at least one ceramic layer and the substrate, and wherein the at least a third layer selected from TiC, TiCN, TiAl, TiN, CrN, CrC, ZrN, ZrC, WC, SiC, $Si_3N_4$, and combinations thereof.

5. The composite structure according to claim 1 wherein the interfacial barrier laminate contains an interfacial layer of $Al_2O_3$ disposed between the at least one ceramic layer and the substrate.

6. The composite structure according to claim 1 wherein the at least one metallic layer is selected front Cr, Ti, Zr, W, Ni, and combinations thereof.

7. The composite structure according to claim 1 wherein the interfacial barrier laminate is between 2 µm and 15 µm thick.

8. The composite structure according to claim 1 wherein the interfacial barrier laminate is between 5 µm and 10 µm thick.

9. The composite structure according to claim 1 wherein the at least one ceramic layer of the interfacial barrier laminate is between 2 µm and 5 µm thick.

10. The composite structure according to claim 1 wherein the at least one metallic layer of the interfacial barrier laminate is between 2 µm and 7 µm thick.

11. The composite structure according to claim 1 wherein the carbide layer of the at least one metallic layer is between 1 µm and 3 µm thick and faces the contiguous diamond coating.

12. The composite structure according to claim 1 wherein the interfacial barrier laminate comprises at least two ceramic layers.

13. The composite structure according to claim 1 wherein the interfacial barrier laminate comprises at least two metallic layers.

14. A composite laminate, comprising:
    a carbon-sensitive substrate;
    an interfacial barrier laminate configured to inhibit the diffusion of carbon, the interfacial barrier laminate formed of at least two layers including a metallic layer and a ceramic layer, the ceramic layer being disposed adjacent the carbon-sensitive substrate;
    a carbide-rich coating disposed over the interfacial barrier laminate; and
    a contiguous diamond layer disposed over the carbide-rich coating.

15. The composite laminate according to claim 14 wherein the interfacial barrier laminate includes at least a third layer diseased between the ceramic layer and the carbon-sensitive substrate, and wherein the at least a third layer selected from the group consisting of high recrystallization temperature amorphous nitrides, high recrystallization temperature amorphous borides, high recrystallization temperature amorphous carbides and combinations thereof.

16. The composite laminate according to claim 14 wherein the ceramic layer is selected from the group consisting of borides, nitrides and carbides of transition metals, and combinations thereof.

17. The composite laminate according to claim 14 wherein the interfacial barrier laminate includes at least a third layer disposed between the carbon-sensitive substrate and the ceramic layer, wherein the at least a third layer is selected from TiC, TiCN, TiAl, TiN, CrN, CrC, ZrN, ZrC, and combinations thereof.

18. The composite laminate according to claim 14 wherein the interfacial barrier laminate comprises an interfacial layer of $Al_2O_3$ disposed between the carbon-sensitive substrate and the ceramic layer.

19. The composite laminate according to claim 14 wherein the metallic layer is selected from Cr, Ti, Zr, W, Ni, and combinations thereof, and wherein the metallic layer is disposed between the ceramic layer and the carbide-rich coating.

20. The composite laminate according to claim 14 wherein the metallic layer of the interfacial barrier laminate is a metal which forms carbides in the presence of carbon.

21. The composite laminate according to claim 14 wherein the interfacial barrier laminate is between 5 μm and 10 μm thick.

22. The composite laminate according to claim 14 wherein the substrate comprises steel.

23. The composite laminate according to claim 14 wherein the substrate comprises cemented carbide.

24. The composite laminate according to claim 14 wherein the interfacial barrier laminate comprises at least two ceramic layers.

25. The composite laminate according to claim 14 wherein the interfacial barrier laminate comprises at least two metallic layers.

26. A cutting tool comprising:
a carbon sensitive substrate;
a ceramic layer disposed over the carbon sensitive substrate configured to inhibit the diffusion of carbon;
a metallic layer disposed over the ceramic layer;
a carbide layer disposed over said metallic layer; and
a contiguous diamond layer disposed over said carbide layer.

27. The cutting tool according to claim 26 wherein the carbon sensitive substrate is steel.

28. The cutting tool according to claim 27 wherein steel is heat-treated after the diamond deposition, resulting in a substrate with a martensite structure.

29. The cutting tool according to claim 26 wherein the carbon sensitive substrate is cemented carbide.

30. The cutting tool according to claim 26 wherein the ceramic layer is selected from borides, nitrides and carbides of transition materials and combinations thereof.

31. The cutting tool according to claim 26, further comprising a layer disposed between the ceramic layer and the carbon sensitive substrate, the layer selected from TiC, TiCN, TiAl, TiN, CrN, CrC, ZrN, ZrC, WC, SiC, $Si_3N_4$, and combinations thereof.

32. The cutting tool insert according to claim 26, further comprising an interfacial layer of $Al_2O_3$ disposed between the ceramic layer and the carbon sensitive substrate.

33. The cutting tool according to claim 26 wherein the metallic layer is selected from Cr, Ti, Zr, and Si and combinations thereof.

34. The cutting tool according to claim 26, further comprising a layer of mixed sp2- and sp3-bonded carbon established on the contiguous diamond layer.

* * * * *